United States Patent
Richter

(10) Patent No.: US 7,939,415 B2
(45) Date of Patent: May 10, 2011

(54) METHOD FOR FORMING A SUBSTRATE CONTACT FOR ADVANCED SOI DEVICES BASED ON A DEEP TRENCH CAPACITOR CONFIGURATION

(75) Inventor: Ralf Richter, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 304 days.

(21) Appl. No.: 12/171,633

(22) Filed: Jul. 11, 2008

(65) Prior Publication Data

US 2009/0194844 A1  Aug. 6, 2009

(30) Foreign Application Priority Data

Jan. 31, 2008  (DE) .......................... 10 2008 007 002

(51) Int. Cl.
*H01L 21/331* (2006.01)
(52) U.S. Cl. .. 438/311; 438/386; 257/532; 257/E21.351
(58) Field of Classification Search .................. 438/131, 438/311, 386; 257/532, E21.351, E21.32, 257/E21.561
See application file for complete search history.

(56) References Cited

U.S. PATENT DOCUMENTS

| 5,759,907 | A  | * | 6/1998  | Assaderaghi et al. | 438/386 |
| 6,825,545 | B2 | * | 11/2004 | Nasr | 257/532 |
| 6,902,982 | B2 | * | 6/2005  | Chen | 438/392 |
| 2002/0113267 | A1 | * | 8/2002 | Brown et al. | 257/355 |
| 2003/0094654 | A1 | * | 5/2003 | Christensen et al. | 257/347 |
| 2004/0248363 | A1 | * | 12/2004 | Bard et al. | 438/243 |
| 2006/0226474 | A1 | * | 10/2006 | Ho et al. | 257/326 |

FOREIGN PATENT DOCUMENTS

DE  103 24 433 A1 * 12/2004

OTHER PUBLICATIONS

Translation of Official Communication from German Patent Office for German Patent Application No. 10 2008 007 002.5 dated Nov. 19, 2008.*

* cited by examiner

*Primary Examiner* — Khiem D Nguyen
(74) *Attorney, Agent, or Firm* — Williams, Morgan & Amerson, P.C.

(57) ABSTRACT

By forming a first portion of a substrate contact in an SOI device on the basis of a trench capacitor process, the overall manufacturing process for patterning contact elements may be enhanced since the contacts may only have to extend down to the level of the semiconductor layer. Since the lower portion of the substrate contact may be formed concurrently with the fabrication of trench capacitors, complex patterning steps may be avoided which may otherwise have to be introduced when the substrate contacts are to be formed separately from contact elements connecting to the device level.

17 Claims, 7 Drawing Sheets

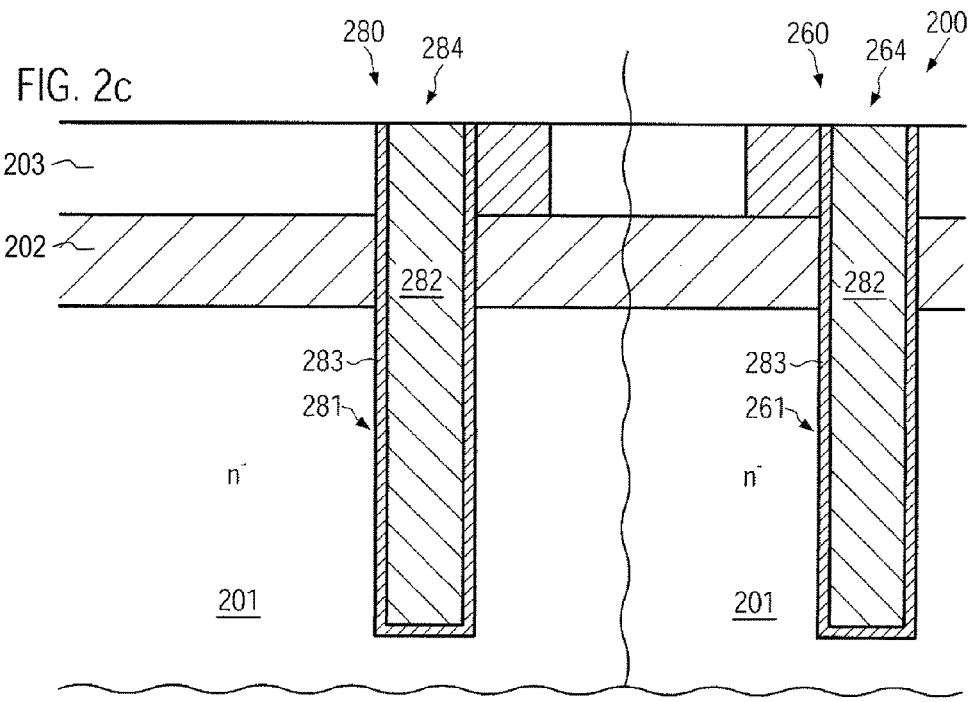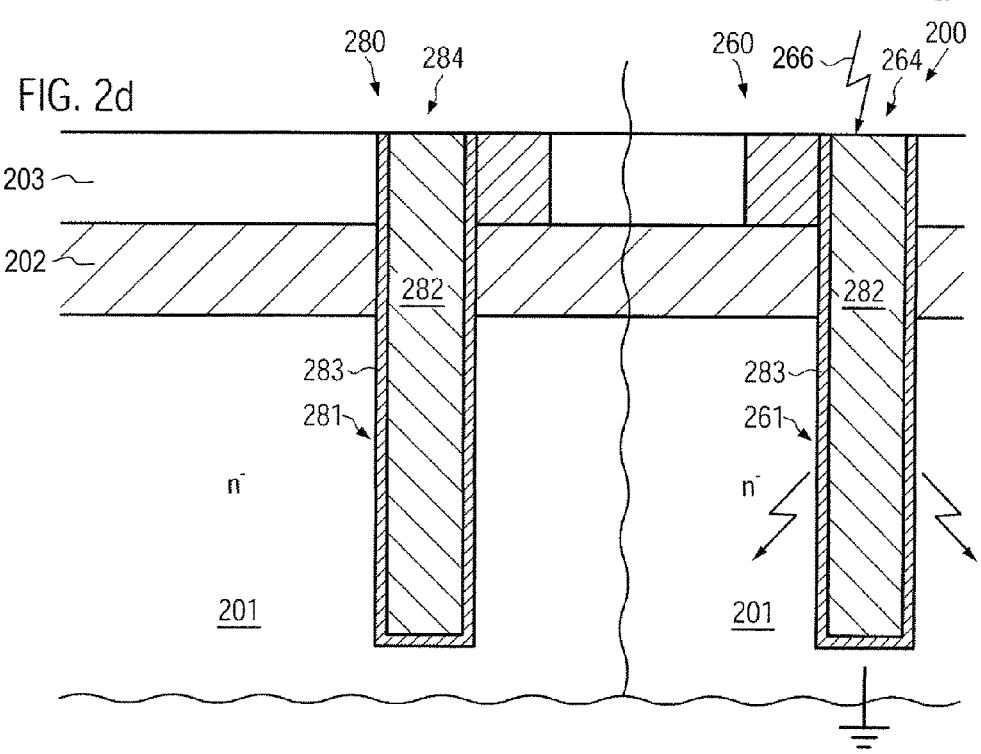

METHOD FOR FORMING A SUBSTRATE CONTACT FOR ADVANCED SOI DEVICES BASED ON A DEEP TRENCH CAPACITOR CONFIGURATION

BACKGROUND OF THE INVENTION

1. Field of the Invention

The present disclosure generally relates to the field of fabricating integrated circuits, and, more particularly, to forming contacts connecting to transistors and a substrate of an SOI device.

2. Description of the Related Art

In modern integrated circuits, a very high number of individual circuit elements, such as field effect transistors in the form of CMOS, NMOS and PMOS elements, resistors, capacitors and the like, are formed on a single chip area. Typically, feature sizes of these circuit elements are steadily decreasing with the introduction of every new circuit generation, to provide currently available integrated circuits having a critical dimension of 40 nm and less in the device level, thereby achieving an improved degree of performance in terms of speed and/or functionality. A reduction in size of transistors is an important aspect in steadily improving device performance of complex integrated circuits, such as CPUs. The reduction in size commonly brings about an increased switching speed, thereby enhancing signal processing performance while, however, increasing dynamic power consumption of the individual transistors. That is, due to the reduced switching time period, the transient currents upon switching a CMOS transistor element from logic low to logic high are significantly increased.

In addition to the large number of transistor elements, a plurality of passive circuit elements, such as capacitors, are typically formed in integrated circuits that are used for a plurality of purposes, such as for decoupling. Decoupling in integrated circuits is an important aspect for reducing the switching noise of the fast switching transistors, since the decoupling capacitor may provide energy at a specific point of the circuitry, for instance, at the location of a fast switching transistor, and thus reduce voltage variations which may otherwise unduly affect the logic state represented by the transistor.

Another important aspect of providing capacitors in advanced semiconductor devices is the incorporation of memory devices including dynamic random access memory (DRAM) devices, which typically require a charge carrier storage element. For example, sophisticated CPUs and also many other advanced integrated circuits require extended memory functionality, wherein the charge carrier storage capability of the capacitors may have an influence on the overall performance of the corresponding DRAM portion. Consequently, the respective trenches for accommodating an appropriate capacitor dielectric and capacitor electrode materials may have to extend deeply into the semiconductor material to provide the desired high capacitance.

As a consequence, a relatively high information storage density may be achieved on the basis of vertical capacitors, thereby enabling the incorporation of extended memory areas in highly complex integrated circuits. For example, due to the continuous shrinkage of features sizes in modern integrated circuits, the number of circuit elements per area unit may allow incorporating increasing functionality into a single chip, thereby achieving increased performance at reduced manufacturing costs. For example, as discussed above, the incorporation of extended memory areas into logic circuits, such as CPUs and the like, may significantly enhance the overall performance due to reduced access times for exchanging data between the CPU core and the memory areas. Thus, typically, so-called cache memories are incorporated into modern CPU designs, wherein access time and the semiconductor area required for defining a memory cell and the peripheral circuitry may be important design aspects. That is, a short access time for writing and reading data bits from a respective memory cell may be preferable in view of a high operating speed to reduce the number of clock cycles of the CPU core required for data exchange with the memory area. Consequently, memory architectures are highly desirable, which may allow short access times, which is typically realized by forming static memory cells that are basically flip flop circuits comprising a plurality of transistor elements so as to store a data bit by setting the state of the flip flop circuit as long as a required minimum supply power is supplied to the memory cell. For example, in currently preferred static memory cell architectures, six transistors are typically used for realizing a single memory cell, that is, for storing one bit of information. Thus, short access time may be accomplished at the cost of a moderately complex architecture of the basic memory cell, thereby requiring highly scaled transistor elements to increase the overall information storage density in static memory areas. On the other hand, by providing a storage element, such as a deep trench capacitor as described above, a basic memory cell may be realized by using a capacitor in combination with a single select transistor, which may therefore result in a significantly increased bit density due to the three dimensional configuration of the storage capacitor, which therefore makes a vertical storage capacitor very attractive for memory areas of high storage density, when less critical constraints with respect to access time are acceptable. That is, due to the requirement of shifting a relatively high amount of charge into the capacitor and from the capacitor for reading or writing a bit of information, the corresponding access time may be significantly higher compared to static memory cells, in which the access times are substantially defined by the switching times of the transistors. Moreover, moderately high amounts of charge leaking into surrounding substrate may have to be replaced on a regular basis, which may result in a moderately complex control regime which may have to be coordinated with respect to memory operations, such as read and write operations. This may also contribute to an overall increased access time for dynamic memory areas. In modern CPU designs, therefore, a certain hierarchy of memory devices may be provided such that memory architectures responding to the fastest available access time may be positioned close to the CPU core and may be used for the most time-critical memory operations, while restricting the memory size so as to not unduly consume valuable chip area. On the other hand, less time-critical data may be stored in memory areas having a high information density, such as the above-described dynamic RAM areas including vertical storage capacitors.

Thus, reducing the feature sizes of the active circuit elements, i.e., the transistors, may provide enhanced performance in time-critical logic blocks due to a reduced switching speed of transistors, for instance, in CPU cores and the like, while also contributing to an enhanced storage density in memory areas, in which a very high number of transistors may have to be provided per area unit. Typically, in complex integrated circuits, CMOS technology on the basis of silicon is one of the most prominent approaches due to the superior characteristics in view of operating speed, power consumption and cost efficiency due to the superior availability of the basic semiconductor material in combination with well-established process technologies and experience in forming integrated circuits over many decades. In CMOS technology, the basic circuit component is a field effect transistor, which may be provided in the form of an N-channel transistor and a P-channel transistor, in which highly doped drain and source regions are separated by a weakly doped channel region, which may exhibit the same or an inverse conductivity type compared to the highly doped drain and source regions. The conductivity of the channel region is controlled by a voltage supplied to a gate electrode, which is separated from the channel region by a thin insulating layer, also referred to as gate dielectric or gate insulation layer. The distance between the drain and source regions along the current flow direction, also referred to as channel length, which may substantially correspond to the length of the gate electrode, represents an important characteristic of the field effect transistor architecture, since, in combination with the charge carrier mobility, the channel length may substantially determine the overall conductivity and thus the switching speed of the transistor. Consequently, the gate length may represent a dominant design criterion for enhancing the performance of individual field effect transistors and thus of the entire integrated circuit.

With the shrinkage of the overall dimensions of individual transistor elements, resulting in increased packing density and thus reduced distance between neighboring circuit elements, in particular in dense circuit areas such as static RAM areas, as previously discussed, the lateral dimensions of contact structures and metallization systems may also be reduced. Typically, the number of interconnections between the individual circuit elements may be higher than the number of circuit elements so that an increasing packing density may impose even more severe constraints on the design and architecture of contact structures and metal layers, which provide the "wiring" of the individual circuit elements. In particular, the manufacturing sequence for forming contacts in a dielectric material which is formed around the transistor elements in the device level may represent one of the most critical process steps in highly scaled semiconductor devices, wherein the corresponding complexity of the respective manufacturing sequence may even further be increased in silicon-on-insulator (SOI) devices. The SOI architecture may frequently be employed in complex circuits due to significant advantages with respect to transistor performance. In an SOI configuration, a substantially crystalline substrate material, for instance in the form of silicon, has formed thereon an insulating layer followed by the actual silicon-based semiconductor layer in and on which the transistor elements are formed. Thus, respective active regions of individual transistor elements or of a group of transistor elements may be dielectrically isolated by the buried insulating layer and shallow trench isolation, which may result in enhanced transistor performance due to a reduced parasitic capacitance of the PN junctions in combination with reduced latch up effects and enhanced radiation immunity of the devices. On the other hand, the dielectric isolation of the semiconductor layer from the substrate material may be associated with a plurality of issues that are to be addressed.

For example, the buried insulating layer may result in an accumulation of charge carriers in the semiconductor layer during various phases in the overall manufacturing flow, for instance during ion implantation processes, plasma assisted etch processes, in particular in the metallization level, and the like, which may require a conductive connection between the semiconductor layer and the substrate material. Furthermore, the reduced thermal conductivity of the buried insulating layer may require a thorough temperature sensing regime across the substrate, which may frequently be accomplished on the basis of diode structures, which are typically formed in the substrate material, thereby also requiring conductive connection contacting the substrate diodes. Hence, a respective contact structure for SOI devices may comprise, in addition to the complex configuration of contact elements connecting to the circuit elements formed in and above the semiconductor layer, also substrate contacts extending from a height level of the semiconductor layer through the buried insulating layer and into the substrate material. Hence, the overall patterning sequence for forming the contact elements of SOI devices may become increasingly complex with reducing features sizes, as will be described with reference to FIGS. 1a and 1b.

FIG. 1a schematically illustrates a semiconductor device 100 comprising a substrate 101 and a buried insulating layer 102. For example, the substrate 101 may represent a substantially crystalline semiconductor material having a certain base doping for defining a certain conductivity type. The buried insulating layer 102 is typically provided in the form of a silicon dioxide having a thickness of several tenths of nanometers and more. A silicon layer 103 is formed on the buried insulating layer 102 and may comprise, in the manufacturing stage shown, a plurality of isolation structures 104, such as shallow trench isolations (STI), thereby defining an "active" region 105 in and above which the transistor structures, such as a transistor 150, are formed. On the other hand, as previously discussed, other circuit elements may be formed on the basis of the substrate material 101. For example, a circuit element 160 may represent a portion of a substrate diode to be formed in the material 101. The substrate diode 160 may comprise a highly doped region 164, possibly in combination with a metal silicide region 166. Furthermore, sidewall spacers 163 may be formed on side-walls of a trench defined by the isolation structure 104 and the buried insulating layer 102. The transistor element 150 comprises a gate electrode structure 151, typically comprised of polysilicon material, which is separated from a channel region 155 by a gate insulation layer 152. As previously discussed, a critical dimension of the transistor 150 may be represented by the length of the gate electrode 151, i.e., in FIG. 1a, the horizontal extension thereof. For instance, the gate length of advanced transistor elements may be approximately 40 nm and less. Furthermore, sidewall spacers 153 may be formed on sidewalls of the gate electrode 151. Additionally, in the active region 105, drain and source regions 154 may be positioned laterally adjacent to the channel region. If required, metal silicide regions 156 may be formed in the drain and source regions 154 and the gate electrode 151, thereby reducing the contact resistance and also providing increased overall conductivity of the gate electrode 151. Furthermore, the transistor 150 and the substrate diode 160 may be enclosed and passivated by an interlayer dielectric material 110, which comprises an etch stop layer 112, for instance provided in the form of silicon nitride, followed by a silicon dioxide material 111. The interlayer dielectric material 110 comprises a plurality of contact elements 113A, 113B and 113C. As illustrated, different height levels for the contact elements 113A, 113B, 113C may be defined by the configuration of the transistor 150 and the substrate diode 160. That is, a first level corresponds to the height level of the gate electrode 151, while a second level corresponds to the height level of the semiconductor layer 103. Finally, a third level corresponds to the height level of the substrate material 101.

The semiconductor device 100 may be formed on the basis of the following processes. The isolation trenches 104 may be formed on the basis of established patterning and deposition processes wherein, prior to, during or after the formation of the isolation structures 104, a corresponding opening for the substrate diode 160 may also be created. Next, the gate electrode 151 and the gate insulation layers 152 may be formed on the basis of advanced techniques including advanced lithography and etch processes. Next, the spacer structure 153 may be formed in a common process with the spacers 163 and respective implantation processes may be performed to define the drain and source regions 154 and the heavily doped region 164 in a common process sequence. Thereafter, the metal silicide regions 156, 166 may be formed, if required, followed by the deposition of the interlayer dielectric material 110. After any planarization techniques, a patterning process is typically performed on the basis of an appropriate resist mask, possibly in combination with a hard mask, to define the lateral position and size for the contact elements 113A, 113B and 113C. During the corresponding etch sequence, the oxide material 110 may be etched while the layer 112 may act as a stop material.

As is evident, due to the very different height levels, highly selective etch recipes in combination with superior process control may be required. Thereafter, the etch stop layer 112 may be opened on the basis of a different etch chemistry, wherein an appropriate selectivity with respect to the metal silicide regions 156, 166 may also be required so as to not unduly etch into the underlying silicon material. Thereafter, well-established deposition processes, for instance for forming appropriate barrier materials such as titanium, titanium nitride and the like, are performed, followed by the deposition of an appropriate contact material, such as tungsten. Next, any excess material may be removed, thereby providing the configuration as shown in FIG. 1a. Thus, the patterning and the subsequent filling of the contacts 113A, 113B and 113C extending to very different height levels may therefore require high etch selectivity in combination with precise process control.

FIG. 1b schematically illustrates the device 100 in a situation wherein closely spaced transistors 170 are provided, for instance, in device areas requiring a high density of transistor elements, such as static RAM areas, as previously explained. In this case, the situation is even more complex since the formation of the respective contacts 113B for the transistors 170 may require an etch process for etching through a substantial amount of material of the etch stop layer 112, while in the transistor 150, a significant amount of oxide material of the layer 111 may still have to be etched for the contacts 113B, while the situation for the substrate diode 160 may be similar to that shown in FIG. 1a. Consequently, a high amount of oxide material may have to be removed for the circuit elements 160 and 150, while only a very low thickness may have to be etched in the transistors 170, which the imbalance between oxide and nitride may further increase for further device scaling, since then the interlayer dielectric material 110 may be substantially comprised of the layer 112 above the transistors 170. Thus, process controllability may be significantly reduced since the removal of the significant portion of the material 112 for the transistors 170 may require extended etch time, which may result in a substantially non-predictable etch conditions in the devices 150 and 160.

Therefore, it has been proposed that for highly scaled semiconductor devices corresponding to the 45 nm technology node and beyond, a separate patterning sequence for the substrate contacts 113C is to be performed. Hence, additional lithography and patterning processes may be added to the conventional manufacturing flow, as described with reference to FIG. 1a, thereby increasing overall production cost and cycle time.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and manufacturing techniques in which substrate contacts in SOI devices may be formed in two different manufacturing sequences while concurrently maintaining a high degree of compatibility with conventional and well-established manufacturing regimes. For this purpose, a first portion of a substrate contact may be formed in a manufacturing process for forming vertical capacitor elements, while a second portion of the substrate contact may be formed commonly with contact elements for the transistor level. Thus, in some illustrative aspects disclosed herein, a substrate contact of highly complex integrated circuits may be obtained without additional patterning processes while also providing less restrictive constraints in view of the manufacturing flow for forming the second part of the substrate contacts. Additionally, the chip area required for forming the substrate contacts may be reduced compared to conventional strategies, thereby also enhancing the overall packing density of the devices. Thus, reduced complexity, in combination with overall enhanced process controllability, may be achieved.

One illustrative method disclosed herein comprises forming a first trench in a first device region and a second trench in a second device region of a semiconductor device, wherein the first and second trenches extend from a height level approximately corresponding to a semiconductor layer through a buried insulating layer and into a substrate material of the SOI semiconductor device. The method further comprises forming an insulating layer on an inner surface of the first and second trenches and filling the first and second trenches with a conductive material. Furthermore, a transistor element is formed in and on the semiconductor layer and an interlayer dielectric material is formed above the transistor element. The method further comprises forming a first contact element and a second contact element in the interlayer dielectric material, wherein the first contact element establishes an electrical connection to the conductive material formed in the first trench and the second contact element connects to the transistor element. Finally, the method comprises selectively establishing a conductive path between the substrate and the conductive material in the first trench to provide a substrate contact.

A further illustrative method disclosed herein relates to forming a substrate contact in an SOI device. The method comprises forming a first trench and a second trench to extend from a height level approximately corresponding to a semiconductor layer of the SOI device through a buried insulating layer and into a substrate material of the SOI device. The method further comprises filling the first and second trenches with a dielectric liner and a conductive material to form a first structure acting as a capacitor and a second structure acting as a capacitor, wherein the substrate represents a first electrode and the conductive material represents a second electrode in each of the first and second structures. Additionally, the method comprises selectively applying a voltage to the first structure to permanently damage the dielectric liner to establish a conductive path between the first electrode and the second electrode of the first structure.

One illustrative semiconductor device disclosed herein comprises a semiconductor material and a buried insulating layer formed on the semiconductor material. The semiconductor device further comprises a semiconductor layer formed on the buried insulating layer and a substrate contact. The substrate contact comprises a trench extending from a height level corresponding to the semiconductor layer through the buried insulating layer and into the semiconductor material. The substrate contact further comprises a liner formed on an inner surface of the trench and is comprised of a dielectric material provided in a damaged state. Furthermore, the substrate contact comprises a first conductive fill material, wherein the liner defines a conductive path between the conductive fill material and the substrate material.

BRIEF DESCRIPTION OF THE DRAWINGS

The disclosure may be understood by reference to the following description taken in conjunction with the accompanying drawings, in which like reference numerals identify like elements, and in which:

FIGS. 2a-2g schematically illustrate cross-sectional views of an SOI device during various manufacturing stages in forming a substrate contact having a first portion substantially corresponding to trench capacitors and a second portion corresponding to contact elements of the device level, according to illustrative embodiments;

Figure 1A:
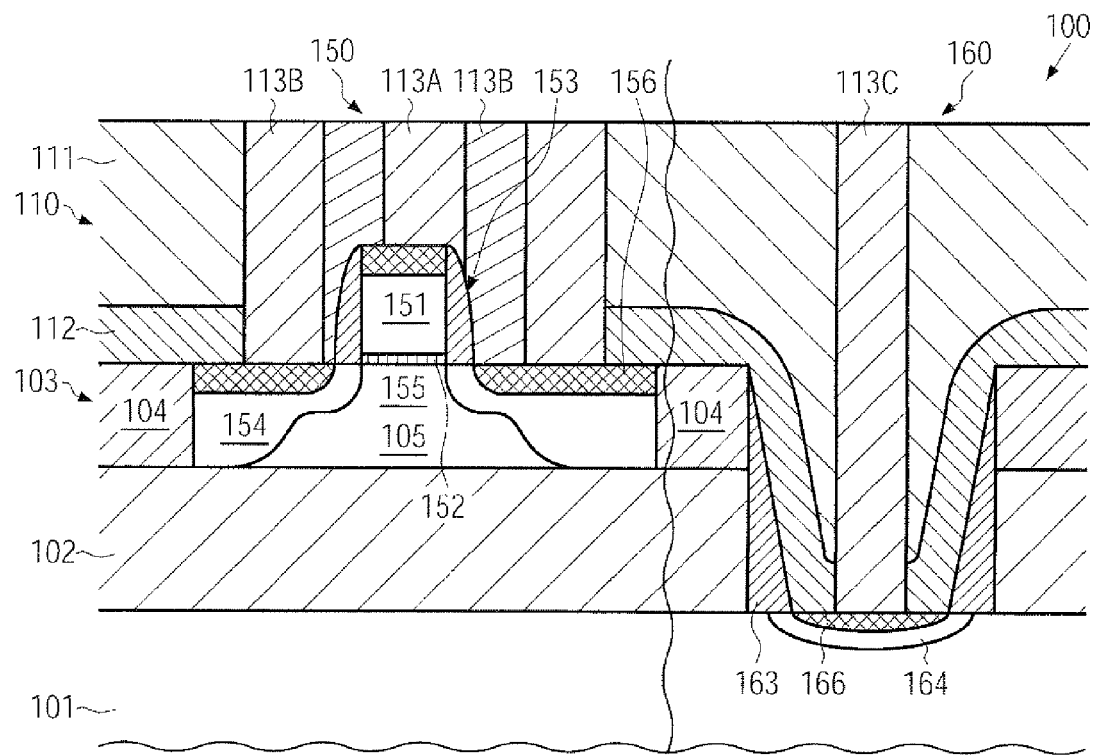
FIGS. 1a-1b schematically illustrate cross-sectional views of a conventional SOI device including a substrate contact formed in a common manufacturing sequence with contact elements connecting to transistor elements.
Figure 1B:
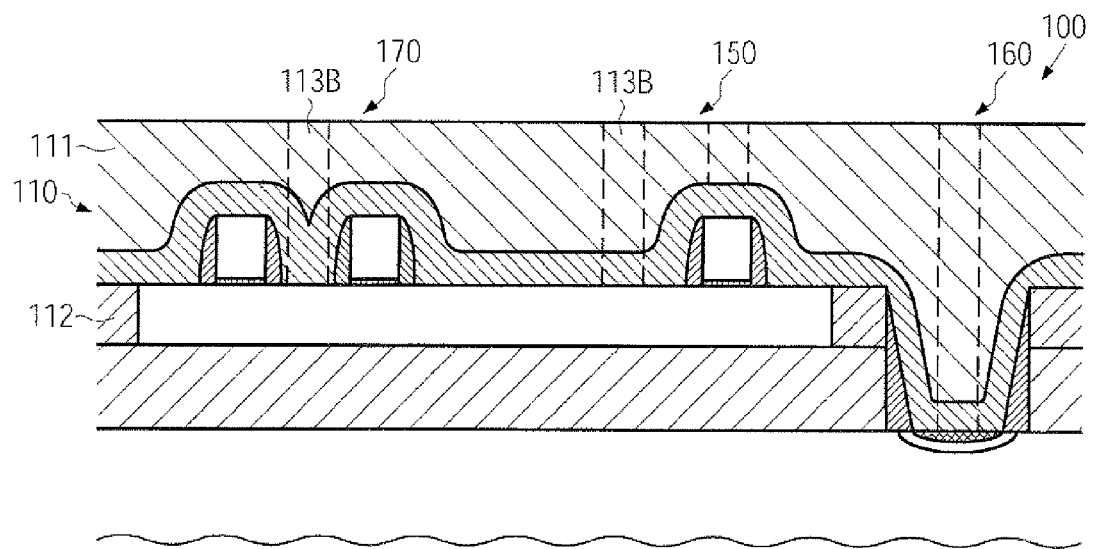

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure addresses the problem of forming a substrate contact in advanced SOI devices by providing techniques and semiconductor devices in which the contact substrate may be formed in at least two separate sequences, thereby significantly relaxing the overall constraints that may be imposed by conventional techniques, as previously explained. It is contemplated herein that separating the manufacturing sequence for forming the substrate contact to different phases may be accomplished without undue additional process complexity by forming a first portion of the substrate contact and trench capacitors, as may be used in highly advanced integrated circuits, in a common manufacturing sequence. Consequently, the first portion of the substrate contact may extend to a height level as determined by the semiconductor layer of the SOI device, that is, the first contact portion may extend from the substrate material through the buried insulating layer at least into the semiconductor layer. Thus, in some illustrative embodiments, additional patterning steps may be avoided, thereby providing increased overall process controllability. In other cases, less critical patterning steps may be combined with the manufacturing sequence for the lower portion of the substrate contact by appropriately adapting the dopant profile and concentration as well as the conductivity type of the substrate material in the vicinity of the substrate contact. That is, if the conductivity type and/or the dopant concentration and profile of the portion of the substrate material in which the trench capacitor have to be formed is considered inappropriate, a desired adaptation may be performed at any appropriate manufacturing stage. For instance, heavily doped N-type or P-type portions may be created when efficient discharge paths, which may be referred to as discharge rods, may have to be provided from the device level into the substrate material to provide a stable and well-defined potential across the entire substrate during various manufacturing stages, in particular during the formation of metallization levels and the like. On the other hand, the patterning sequence of the contact elements extending to gate electrodes and active regions may be specifically adapted to the device geometry of the technology under consideration, thereby providing an enhanced process window, which may enable a reliable patterning of the contact elements for highly scaled devices corresponding to the 45 nm technology node and beyond. Furthermore, by the separate provision of the "buried" contact portion, an enhanced degree of design flexibility may be obtained since generally the area consumption of the substrate contacts may be less compared to conventional techniques, while also the second portion may be aligned to the first portion, if desired, while, in other cases, the buried portion may be electrically connected to the active semiconductor region laterally adjacent to the buried portion, thereby enabling the positioning of the upper contact portion on the active semiconductor layer at a desired location.

In some illustrative aspects, the concepts disclosed herein may enable the formation of substrate diodes in a highly independent manner from actual transistor elements, without adding additional process complexity. For this purpose, the P-type region and the N-type region for the substrate diode may be formed to extend at least down to a depth of the trench capacitors, wherein the dopant concentration and profile may be adjusted to obtain the desired diode characteristics. The regions of different conductivity type may then be contacted on the basis of "capacitors" that may be formed along with the trench capacitors, as described above. Consequently, a highly efficient manufacturing sequence may be accomplished, thereby decoupling the definition of the diode characteristics from the definition of the PN junctions in the transistor level while not adding to additional process complexity or even reducing the overall process complexity.

Figure 2A:
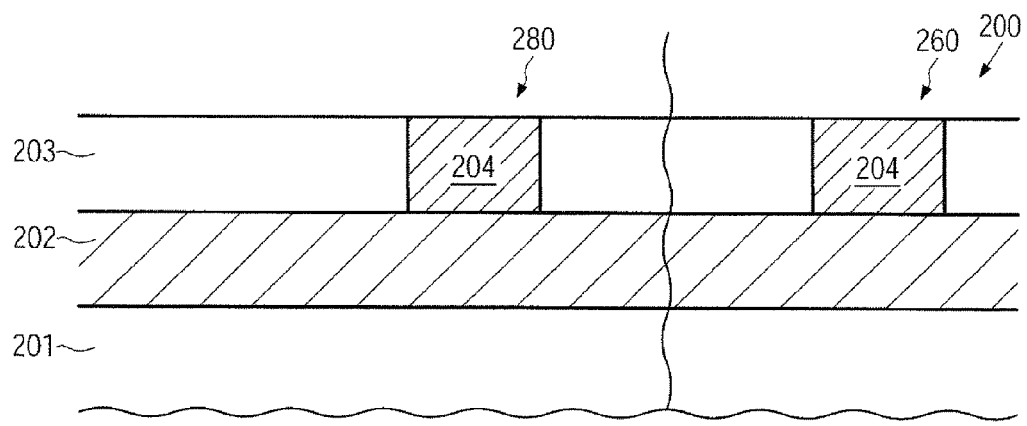

FIG. 2a schematically illustrates a cross-sectional view of a semiconductor device 200 in an appropriate manufacturing stage in which trench capacitors may be formed at any appropriate position across a substrate 201. Thus, depending on the overall process strategy, other circuit elements may have been formed, at least partially, in other device areas, while in the illustrative embodiment shown in FIG. 2a, respective circuit elements, such as transistors and the like, may be provided in a later manufacturing stage. The SOI device 200 may comprise a buried insulating layer 202, for instance comprised of silicon dioxide, or any other appropriate dielectric material with a specific thickness, which may be approximately 100-200 nm for advanced semiconductor devices, while other values may be selected in accordance with the device requirements. Furthermore, a semiconductor layer 203, such as a silicon layer, may be formed on the buried insulating layer 202, wherein it should be appreciated that the semiconductor layer 203 may be comprised of any other appropriate semiconductor materials or may have incorporated therein or may receive, in addition to specific dopant species, other species for adjusting the overall electronic characteristics. For instance, germanium, tin, carbon and the like may be contained or may be incorporated at any appropriate manufacturing stage into the semiconductor layer 203. Furthermore, in the manufacturing stage shown, it may be assumed that isolation structure 204 may be formed at positions at which substrate contacts and/or trench capacitors are to be formed. It should be appreciated, however, that substrate contacts and/or trench capacitors may also be formed in the semiconductor layer 203 without providing an isolation structure surrounding, at least partially, the trench capacitor and/or substrate contact. In some illustrative embodiments, the capacitors and/or contacts may be formed so as to connect the laterally adjacent portion of the semiconductor layer 203. For convenience, a region 260 may represent a first device region in which a substrate contact has to be formed, while a second region 280 may represent a second device region for receiving trench capacitors therein.

The SOI device 200 may be formed on the basis of the following processes. Prior to and/or after creating appropriate dopant concentrations and profiles for basic transistor configurations, substrate diodes, trench capacitors and the like in the substrate material 201 and the semiconductor layer 203, the isolation structures 204 may be formed on the basis of well-established strategies, wherein, however, the positioning of the isolation structures 204 may be adapted to the requirements for forming trench capacitors and substrate contacts at appropriate positions across the substrate 201. That is, the appropriate size and location of the isolation structures 204 may be defined during the corresponding patterning sequence.

Figure 2B:
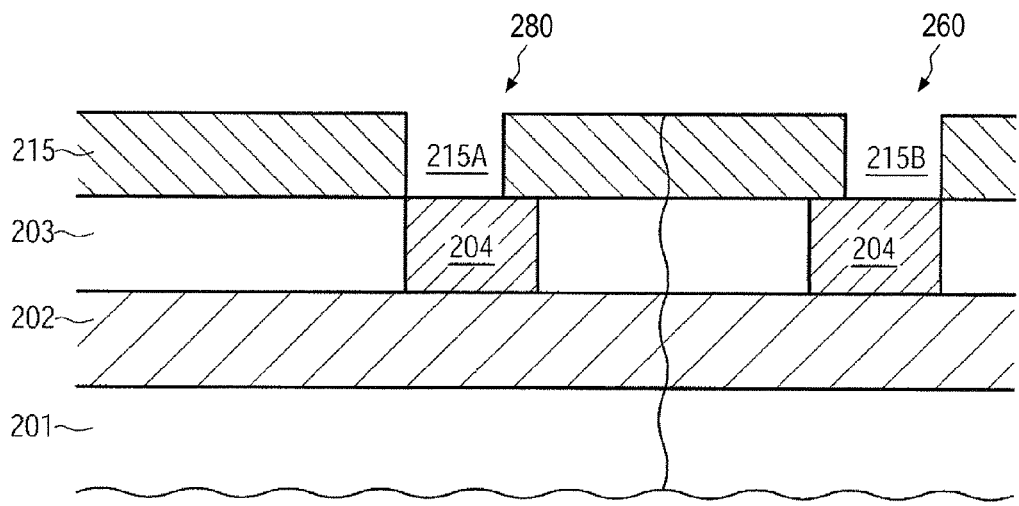

FIG. 2b schematically illustrates the SOI device 200 in an advanced manufacturing stage in which a hard mask 215 may be formed above the semiconductor layer 203 and may comprise openings 215A, 215B, wherein at least the opening 215A may correspond to the lateral size of a trench capacitor to be formed in the region 280. The opening 215B may be appropriately dimensioned so as to comply with the requirements of a substrate diode portion. That is, the dimensions of the opening 215B may be selected identically or different to the dimensions of the opening 215A, depending on the overall device strategy, wherein even a significant variation of the dimension may be deemed appropriate since any process variations, for instance with respect to etch depth during a subsequent patterning process, may be less critical, as typically the desired depth of the capacitor trenches may be selected to be one to several micrometers so as to extend deeply into the substrate material 201. For example, if reduced lateral dimensions are desired for the opening 215B, a possibly reduced etch rate may be acceptable since the corresponding trench may still sufficiently extend into the substrate material 201. The hard mask 215 may be formed on the basis of well-established techniques, as may typically be employed when forming trench capacitors. That is, appropriate deposition and lithography techniques may be used in combination with anisotropic etch processes.

FIG. 2c schematically illustrates the SOI device 200 in a further advanced manufacturing stage. As illustrated, a trench 281 may be formed in the second device region 280 so as to extend from a height level substantially corresponding to the semiconductor layer 203 through the buried insulating layers 202 and into the substrate material 201. It should be appreciated that the proportions of the trench 281 in relation to the thickness of the layers 202 and 203 may not be drawn to scale, since typically the depth of the trench 281 may be several hundred nanometers and significantly more, such as several micrometers, as previously discussed. Similarly, in the first device region 260, a trench 261 may be formed which may have substantially the same configuration as the trench 281 or which may differ therefrom, for instance in lateral size and depth, depending on the overall requirements as previously explained. Furthermore, the trenches 281, 261 may have formed on inner surfaces thereof a dielectric material 283 which may be considered as a capacitor dielectric material having a desired composition and thickness. For example, silicon dioxide, silicon nitride, silicon oxynitride and the like may be used with a thickness of, for instance, approximately 5-10 nm, while other values may be selected in accordance with device requirements. Moreover the trenches 281, 261 may be filled with a conductive fill material, such as doped polysilicon and the like. Thus, in the manufacturing stage shown, the trench 281, the liner material 283 and the fill material 282 may define a structure 284 which may be considered as a capacitor, wherein the conductive material 282 may act as a first electrode, the dielectric 283 as a capacitor dielectric and the surrounding substrate material 201, which may, for instance, have an N-type conductivity or a P-type conductivity, depending on the device requirements, may act as a second capacitor electrode. Similarly, the trench 261, in combination with the components 283 and 282, may define a structure 264 which, in the present stage, may be considered as a capacitor structure.

The SOI device 200 as shown in FIG. 2c may be formed on the basis of any appropriate manufacturing technique for forming deep trenches and filling the same with a dielectric liner material followed by a conductive fill material. For this purpose, anisotropic etch techniques may be used in combination with the mask 215 for etching through the isolation structures 204 and the buried insulating layer 202, followed by a further etch process for etching into the substrate material 201. Thereafter, the liner 283 may be deposited, for instance, by thermal chemical vapor deposition (CVD) processes and the like using appropriate precursor materials. Next, the conductive material 282, for instance in the form of doped polysilicon, may be deposited, for instance, by low pressure CVD techniques or any other appropriate process strategies based on well-established recipes. Thereafter, the excess material and the mask 215 may be removed, for instance, by etching, chemical mechanical polishing (CMP) and the like.

FIG. 2d schematically illustrates the SOI device 200 according to illustrative embodiments in which an electrical connection between the "capacitor electrode" 282 of the structure 264 to the "capacitor electrode" in the form of the substrate material 201 may be established via the dielectric material 283. For this purpose, an appropriate voltage 266 may be selectively applied to the structure 264 and the substrate 201 in order to intentionally cause an electric breakthrough, thereby damaging the dielectric liner 283 permanently, which may therefore no longer act as an insulating material. For example, a voltage pulse of several tenths of volts may be sufficient for permanently damaging the dielectric material 283, depending on the initial layer thickness. Consequently, the structure 264 may now represent a first portion of a substrate contact, since the fill material 282 in the structure 264 and the substrate 201 may be electrically connected via the voltage pulse 266. It should be appreciated that, in other illustrative embodiments, the intentional electrical destruction of the layer 283 may be performed in a later manufacturing stage.

Figure 2E:
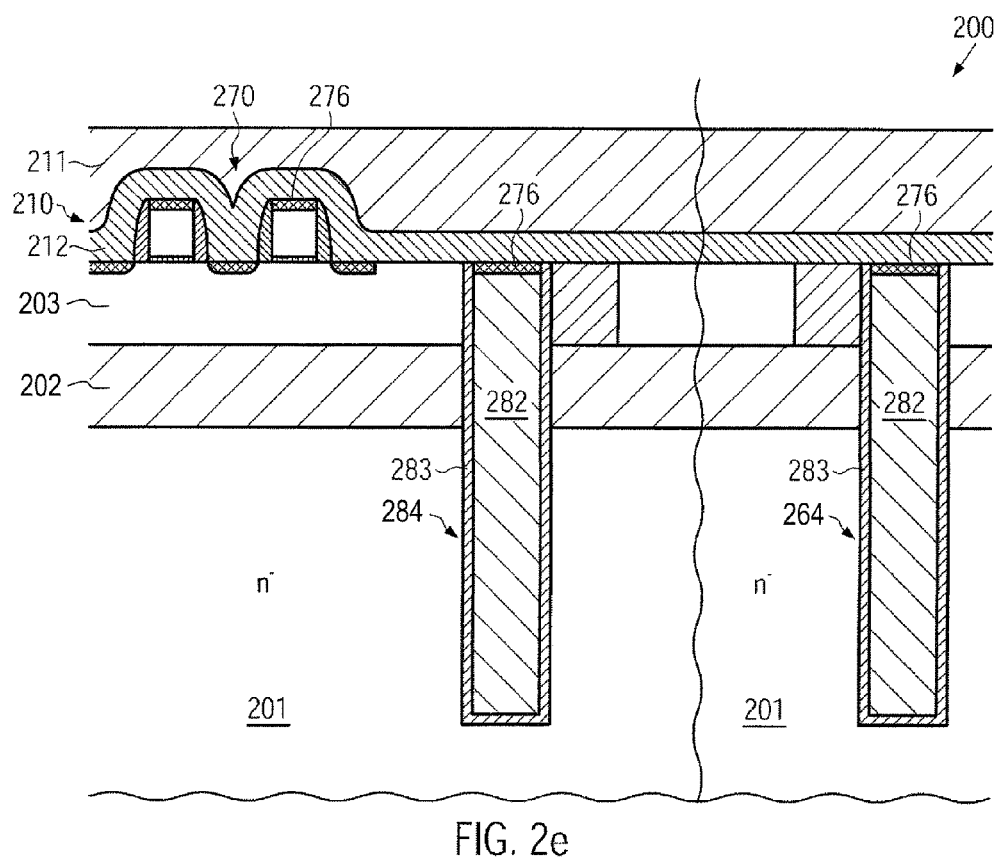

FIG. 2e schematically illustrates the SOI device 200 in a further advanced manufacturing stage. As shown, in this stage, transistor elements 270 may be formed in the device region 280, wherein it should be appreciated that the transistor devices 270 may have been formed prior to the formation of the structures 284, 264, depending on the overall process strategy. The transistors 270 may basically have the same configuration as previously described with reference to the transistors 150 and 170. In one illustrative embodiment, the transistors 270 may represent circuit elements of a memory area, such as a dynamic RAM area, which may represent an embedded dynamic RAM area of a complex circuit, such as a CPU and the like. In other illustrative cases, the transistors 270 may represent any other devices, for instance, speed-critical transistors and the like, which may require a decoupling capacitor to reduce switching noise and the like, as previously discussed. Furthermore an interlayer dielectric material 210 may be provided which may include an etch stop layer 212 and a further dielectric material 211, which may have the same configuration as previously discussed with reference to the device 100. It should be appreciated that, depending on the device geometry under consideration, the essential part of the interlayer dielectric material 210 between the transistors 270 may be the material 212, as previously explained.

The SOI device 200 as shown in FIG. 2e may be formed on the basis of substantially the same process techniques as described above with reference to the device 100. In embodiments shown, it may be assumed that, during the transistor formation process, respective contact areas in the form of metal silicide regions 276 may also be formed in the structures 284 and 264, while in other cases the metal silicide regions may be omitted in the structures 284 and 264. Thus, any contacts connecting to the transistors 270 and the structure 264 may be formed on the basis of a common patterning regime in which the transistor-specific configuration of the interlayer dielectric material 210 may be taken into consideration without the requirement of etching through extended portions of silicon dioxide, as is the case in the conventional technique. Hence, well-established process recipes may be adapted to the device configuration as shown in FIG. 2e, thereby providing increased process window and enhanced controllability, which may enable the adaptation of these concepts to even more advanced technology nodes. Hence, appropriate masking regimes may be used to appropriately position an opening or a contact element with respect to the structure 264, i. e., a lower portion of a substrate contact, and etching through the interlayer dielectric material 210. Thereafter, the corresponding contact openings may be filled on the basis of well-established techniques while also during the deposition process less critical process conditions may be encountered which may also provide extendibility of existing technologies to future device generations.

Figure 2F:
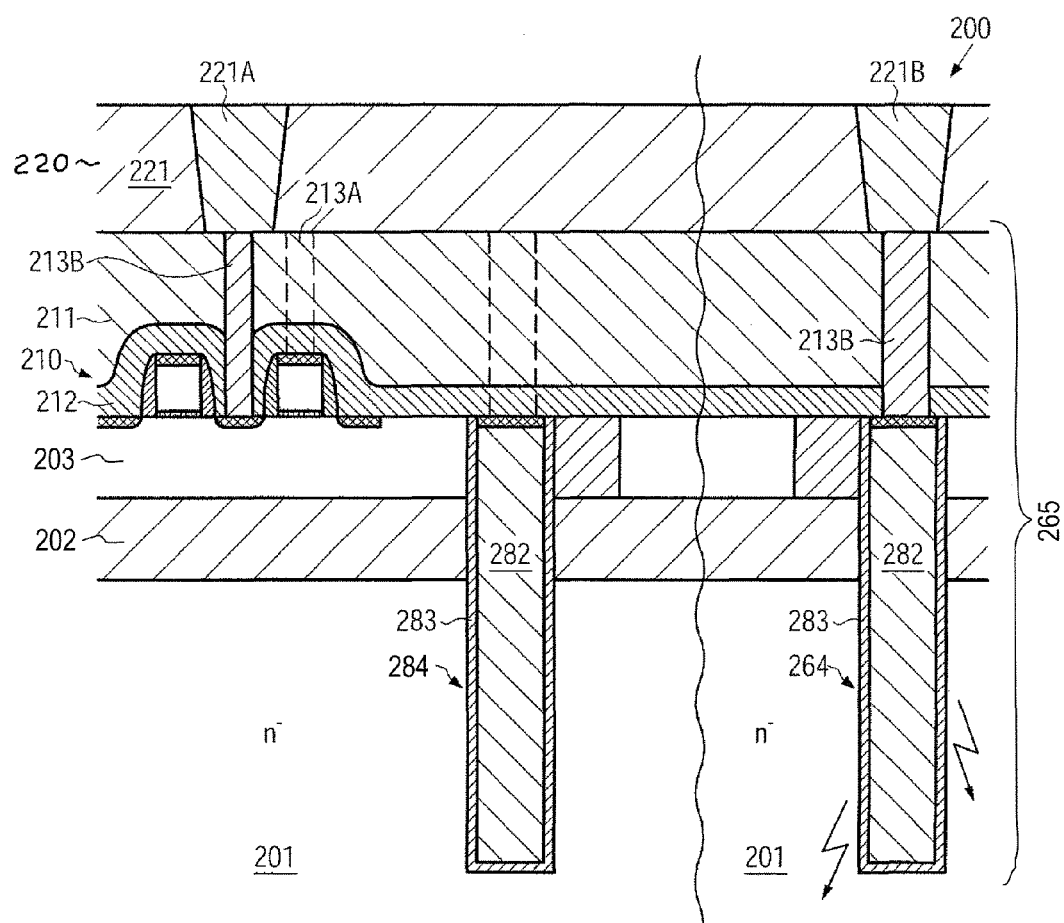

FIG. 2f schematically illustrates the SOI device 200 in a further advanced manufacturing stage in which contact elements 213A corresponding to the uppermost height level and contact elements 213B corresponding to the height level of the semiconductor layer 203 are formed to connect to the transistors 270 and the structure 264, respectively. It should be appreciated that, depending on the device requirements, a contact 213B may also be formed to the capacitor 284. In the embodiment shown, the contact element 213B, which in combination with the structure 264 may be considered as a substrate contact 265, may be positioned "vertically" above the structure 264.

In this respect, it should be appreciated that any positional information is to be considered as position information relative to the substrate 201 in combination with the buried insulating layer 202. That is, a vertical direction is to be understood as a direction substantially perpendicular to an interface between the buried insulating layer 202 and the substrate 201. Similarly, a lateral or horizontal direction may be understood as a direction substantially parallel to the interface between the layer 202 and the material 201.

In other illustrative embodiments, the contact element 213B of the substrate contact 265 may be positioned laterally adjacent to the structure 264 when an electrical connection between the structure 264 and the semiconductor layer 203 is provided, as will be explained later on in more detail.

Moreover, in the manufacturing stage shown, a first metallization layer 220 may be formed above the contact structure comprised of the interlayer dielectric material 210 and the contact elements 213A, 213B. The metallization layer 220 may comprise an appropriate dielectric material 221, for instance comprising a low-k dielectric material, and metal lines 221A, 221B, which may connect to at least some of the contact elements 213A, 213B.

The metallization layer 220 may be formed in accordance with well-established techniques, for instance, by depositing the dielectric material 221 and patterning the same to obtain appropriate openings, which may then be filled by the metal-containing material, for instance copper and the like, in combination with appropriate conductive barrier materials. During various phases of the entire manufacturing flow, a plurality of process steps may have to be performed in which a more or less amount of excess charge may be created in the device level, that is, in the semiconductor layer 203 and above, which may result in an undue charging of the device 200. For example, during ion implantation processes, and in particular during plasma assisted etch processes and deposition processes, significant charges may be built up in the device level, thereby creating a voltage between the semiconductor layer 203 and the substrate 201. Hence, in some illustrative embodiments, the substrate contact 265, or at least the lower portion 264 thereof, when earlier manufacturing stages are considered, may be used as an efficient discharge path. Thus, the structure 264 may be appropriately positioned across the substrate 201 to allow an efficient exchange of charges between the device level and the substrate 201. In some illustrative examples, a corresponding accumulation of charges may result in an electrical destruction of the liner material 283 in the structure 264, thereby providing a conductive path. That is, upon appropriate exposure to respective environmental conditions during a charge creating manufacturing process, the structure 264 may act as a discharge rod, which may concurrently result in a desired creation of a conductive path between the conductive material 283 and the substrate 201 via a damaged state of the "dielectric material" 283. In other cases, the dielectric material 283 may have been damaged in an earlier manufacturing stage, as previously discussed, thereby immediately acting as an efficient discharge path. For example, plasma assisted etch processes may tend to more intensively charge the substrate surface, depending on the amount of metal contained therein. Thus, during the formation of the metallization layer 220, and any additional metallization layers, the substrate contact 265 may efficiently equalize potential differences, thereby enhancing reliability and yield, wherein a "self-triggering" mechanism for creating the conductive path may be obtained.

Figure 2G:
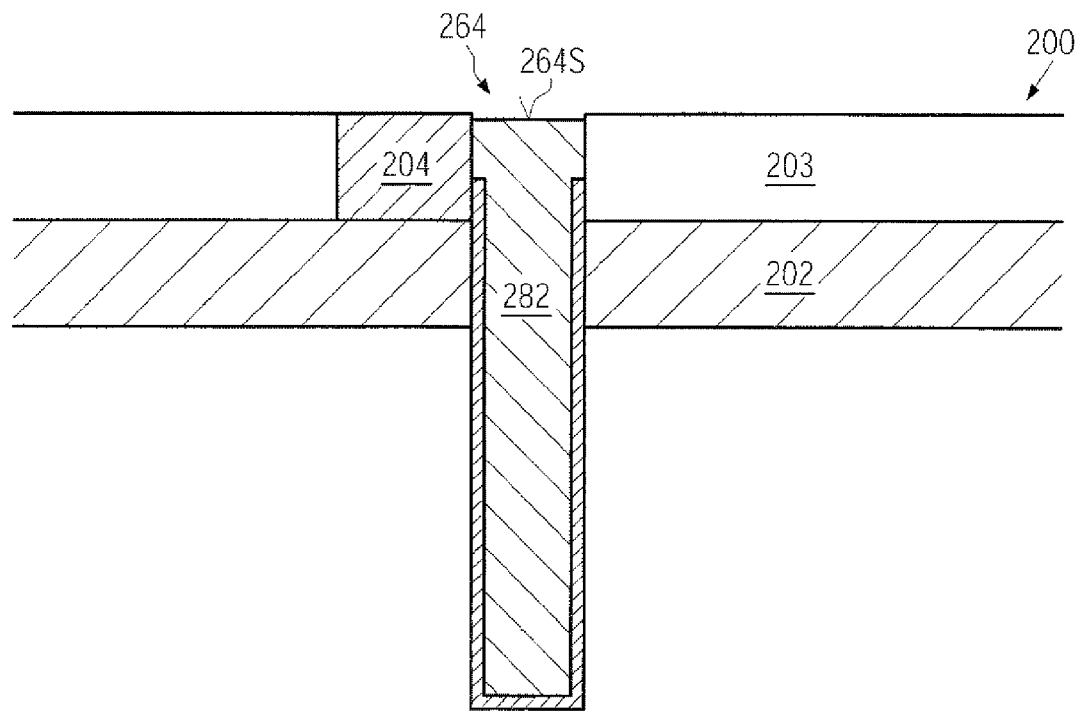

FIG. 2g schematically illustrates the SOI device 200 according to further illustrative embodiments in which the conductive material 282 in the structure 264 and also in the capacitors 284 (not shown) may be electrically connected to the semiconductor layer 203. For this purpose, a portion of the dielectric material 283 may have been removed, for instance possibly in combination with a portion of the dielectric material 282, which may then be re-deposited to provide the desired electrical connection to the semiconductor layer 203. It should be appreciated that the structure 264 may therefore extend to a height level that is substantially determined by the semiconductor layer 203, which is to be understood such that an upper surface 264S of the structure 264 may have any height level above the buried insulating layer 202. That is, the surface 264S may be substantially flush with the layer 203 or may form a recess, depending on the overall device requirements. Providing a direct electrical connection between the layer 203 and the conductive material 282 in the structure 264, and also in the capacitors 284, may provide increased design flexibility, so that the capacitor may be directly connected to a transistor, such as the transistors 270, or may even represent a part thereof, while the structure 264 may be contacted via the layer 203 in any appropriate manner.

Figure 2H:
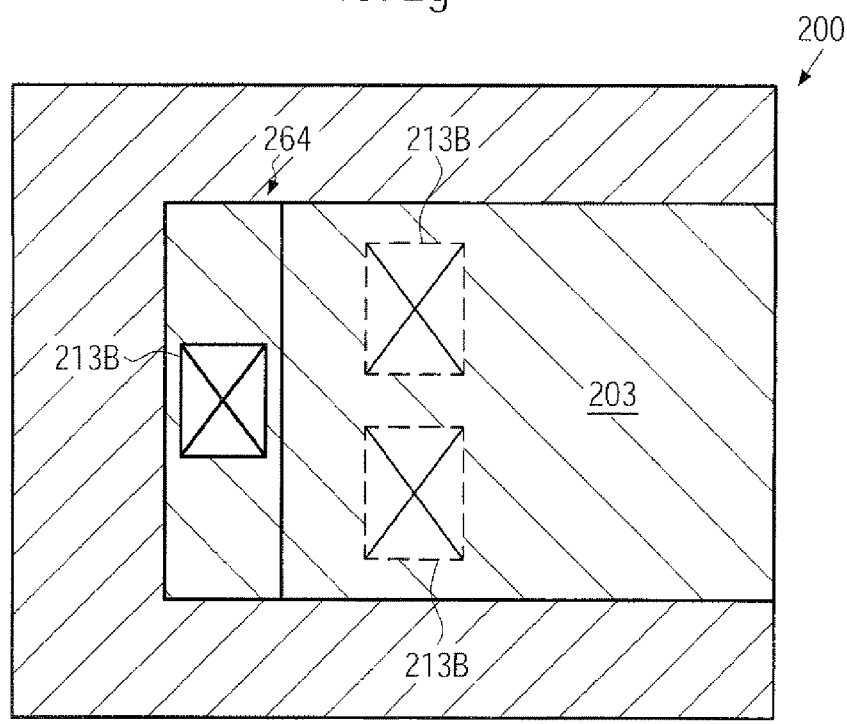
FIG. 2h schematically illustrates a top view of the semiconductor device with possible positional relationships of contact elements connecting to the device layer relative to the contact portion of the substrate contact connecting to the substrate material, according to illustrative embodiments.

FIG. 2h schematically illustrates a top view of the SOI device 200 wherein a plurality of possible positions of a contact element 213B may be illustrated. For example, one or more of the contact elements 213B may be positioned vertically above the structure 264, as previously illustrated, or one or more contact elements 213B may contact the semiconductor layer 203 adjacent to the structure 264. Thus, if required, a lateral conductive path may be provided by the layer 203 which may be appropriately doped when the position of the structure 264, i.e., the lower portion of the substrate contact 265, and the position of the contact elements 213B may be in conflict with other design criteria.

Figure 2I:
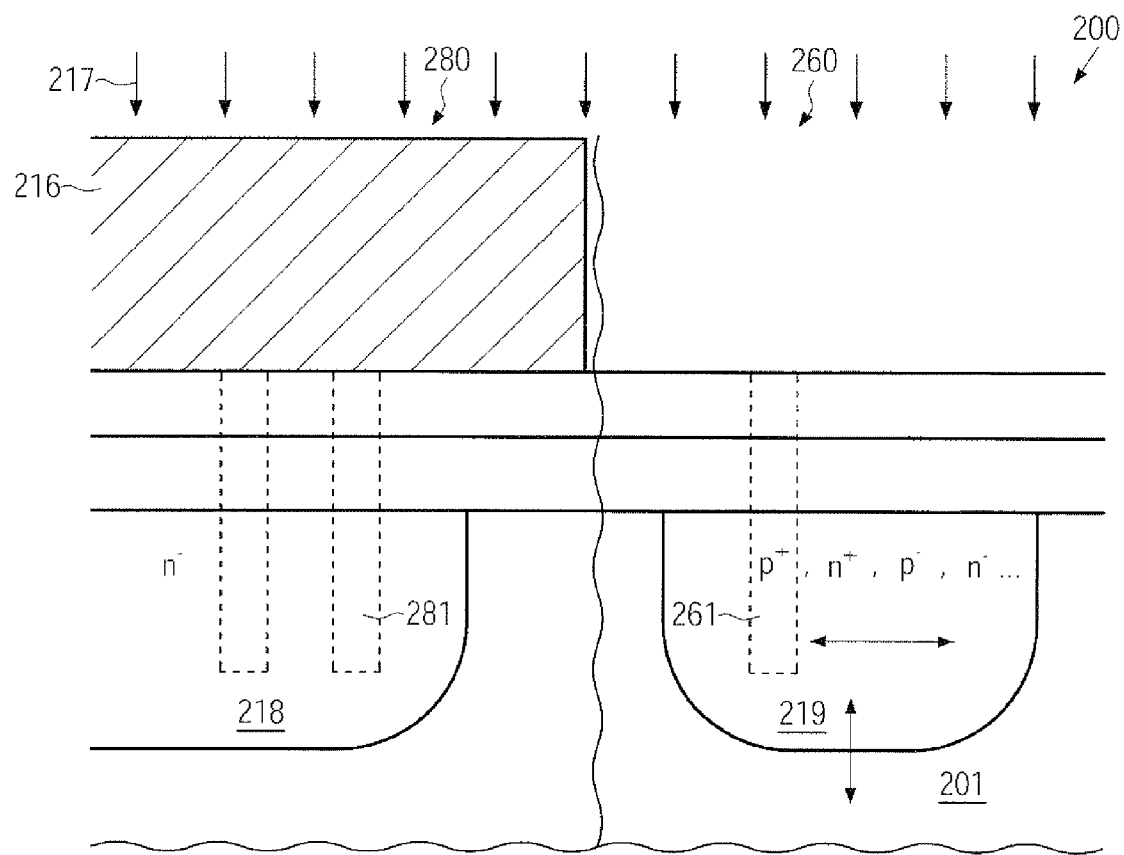
FIG. 2i schematically illustrates the semiconductor device in a manufacturing stage for appropriately designing the dopant profile in the substrate material to enhance performance of the substrate contact, according to still further illustrative embodiments.

FIG. 2i schematically illustrates the SOI device 200 according to further illustrative embodiments. As previously explained, the substrate material 201 may be appropriately doped to provide the desired electrode characteristics for the trench capacitors 284. If a corresponding dopant concentration and/or profile and conductivity type may be considered inappropriate for at least some of the substrate contacts 265, an appropriate adaptation may be accomplished at any appropriate manufacturing stage. For example, a doped region 218 may be appropriate for forming therein capacitor trenches, such as the capacitors 284, and may be formed in the device region 280, while an appropriately doped region 219 may be provided in the device region 260. For this purpose, appropriate masking regimes using an implantation mask 216 may be provided and one or more implantation processes may be performed to introduce the desired dopant species. For example, the region 219 may be doped to have an N-type conductivity or a P-type conductivity on the basis of any desired dopant species, while also a penetration depth and thus a vertical extension of the region 219 may be defined on the basis of implantation parameters. For example, the depth of the region 219 may be selected such that the trench 261 may be substantially completely within region 219, while in other cases the trench 261 may extend through the region 219, depending on the overall requirements. Consequently, the electrical characteristics of the substrate contact 265 may be efficiently adjusted on the basis of less critical lithography steps, thereby not significantly contributing to the overall process complexity.

Figure 2J:
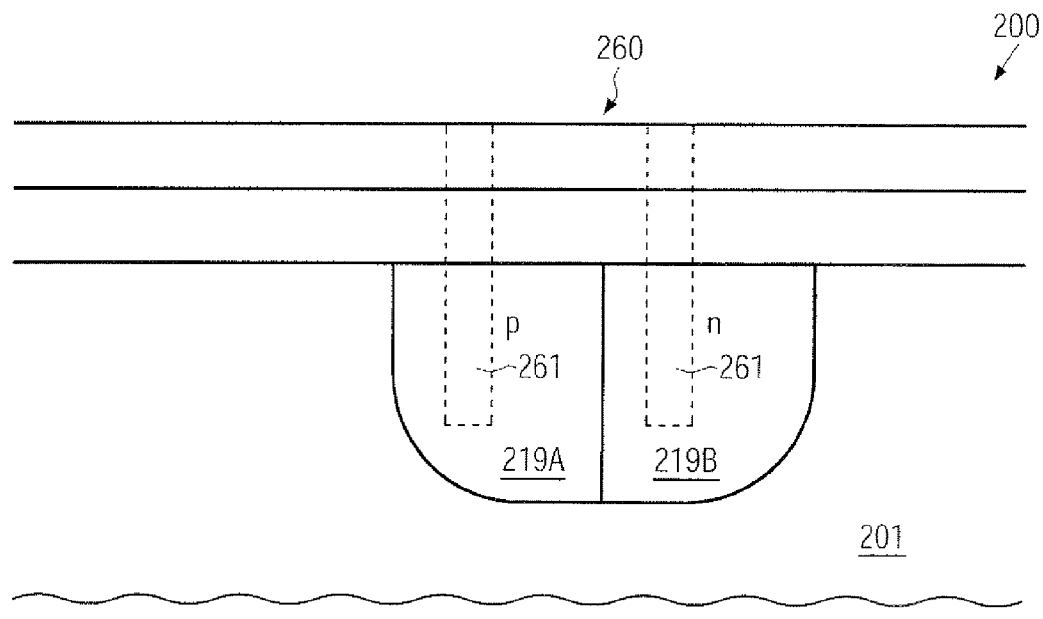
FIG. 2j schematically illustrates a cross-sectional view of an SOI device with a substrate diode contacted by trench substrate contacts, according to still further illustrative embodiments.

FIG. 2j schematically illustrates the SOI device 200 according to further illustrative embodiments in which the device region 260 may have formed therein appropriately designed doped regions 219A, 219B so as to form a substrate diode which may be used for thermal sensing applications and the like. For this purpose, the dopant concentration in the regions 219A, 219B may be appropriately defined to obtain the desired diode characteristics, irrespective of any dopant levels in the device layer. The vertical extension of the regions 219A, 219B may be selected such that the corresponding trenches 261 and thus contacts may be within the regions 219A, 219B so as to avoid a shorting of the PN junction in the remaining substrate material 201. Consequently, the substrate diode comprised of the regions 219A, 219B may be formed substantially independently from manufacturing processes performed in the device level, thereby providing enhanced diode characteristics, irrespective of any modifications in the device level.

As a result, the present disclosure provides techniques and semiconductor devices in which a substrate contact may be provided in the form of a lower portion extending from a height level corresponding to the semiconductor layer into the substrate material, which may be formed together with trench capacitors, thereby not contributing to the overall process complexity. Thereafter, the substrate contact may be completed during a contact patterning process for forming contact elements down to the semiconductor layer, thereby significantly relaxing process constraints and enabling extending techniques disclosed herein to further advanced device generations without significant modifications.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first trench in a first device region and a second trench in a second device region of an SOI semiconductor device, said first and second trenches extending from a height level approximately corresponding to a semiconductor layer through a buried insulating layer and into a substrate material of said SOI semiconductor device;
    forming an insulating layer on an inner surface of said first and second trenches;
    filling said first and second trenches with a conductive material;
    forming a transistor element in and on said semiconductor layer;
    forming an interlayer dielectric material above said transistor element;
    forming a first contact element and a second contact element in said interlayer dielectric material, said first contact element establishing an electric connection to said conductive material formed in said first trench and said second contact element connecting to said transistor element; and
    selectively establishing a conductive path between said substrate and said conductive material in said first trench so as to provide a substrate contact, wherein selectively establishing said conductive path comprises applying a voltage across said conductive material in said first trench and said substrate to induce an electric breakdown through said insulating layer in said first trench.

2. The method of claim 1, wherein said conductive path is established prior to forming said first and second contact elements.

3. The method of claim 1, wherein said conductive path is established after forming said first and second contact elements.

4. The method of claim 1, further comprising using said first trench as a discharge path during at least one manufacturing process.

5. The method of claim 1, wherein said second trench, including said insulating layer and said conductive material, is used as a capacitor.

6. The method of claim 5, wherein said second device region represents a region for forming a memory area and said capacitor represents a storage capacitor.

7. The method of claim 1, further comprising selectively providing a dopant species in said first device region so as to adapt a conductivity of said conductive path.

8. The method of claim 1, wherein a depth of said first and second trenches is approximately 1 µm or greater.

9. The method of claim 1, wherein forming said transistor element comprises forming at least one feature of said transistor element so as to have one lateral dimension of approximately 40 nm or less.

10. The method of claim 1, further comprising forming a metallization system above said transistor element and establishing said conductive path by supplying a voltage to said conductive material in said first trench via said metallization system.

11. The method of claim 1, wherein said first contact element is formed so as to be vertically above said first trench.

12. The method of claim 1, wherein said electric connection is established via said semiconductor layer.

13. A method of forming a substrate contact in an SOI device, the method comprising:
    forming a first trench and a second trench so as to extend from a height level approximately corresponding to a semiconductor layer of said SOI device through a buried insulating layer and into a substrate material of said SOI device;
    filling said first and second trenches with a dielectric liner and a conductive material to form a first structure acting as a capacitor and a second structure acting as a capacitor, said substrate representing a first electrode and said conductive material representing a second electrode in each of said first and second structures; and
    selectively applying a voltage to said first structure so as to permanently damage said dielectric liner to establish a conductive path between said first electrode and said second electrode of the first structure.

14. The method of claim 13, further comprising forming a transistor element in and on said semiconductor layer, forming an interlayer dielectric material above said transistor element and forming a first contact and a second contact in said interlayer dielectric material in a common process sequence, said first contact electrically connecting to said first structure.

15. The method of claim 13, further comprising selectively adjusting at least one of a dopant concentration and a conductivity type at least in a portion of said substrate acting as said first electrode.

16. The method of claim 13, further comprising performing a manufacturing process and using said first structure as a discharge path for removing charges accumulating in said semiconductor layer during said manufacturing process.

17. The method of claim 14, further comprising forming a conductive element so as to electrically connect said transistor element with said second structure.

* * * * *